(12) United States Patent
Germanenko et al.

(10) Patent No.: US 9,116,445 B2
(45) Date of Patent: Aug. 25, 2015

(54) RESONANT CAVITY CONDITIONING FOR IMPROVED NONLINEAR CRYSTAL PERFORMANCE

(71) Applicant: KLA-Tencor Corporation, Milpitas, CA (US)

(72) Inventors: Igor N. Germanenko, San Jose, CA (US); Marc Shiraki, San Jose, CA (US); Stephen Richard Friberg, Mountain View, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/835,403

(22) Filed: Mar. 15, 2013

(65) Prior Publication Data

US 2014/0146838 A1  May 29, 2014

Related U.S. Application Data

(60) Provisional application No. 61/731,421, filed on Nov. 29, 2012.

(51) Int. Cl.
*H01S 3/04* (2006.01)
*G03F 7/20* (2006.01)
*H01S 3/00* (2006.01)

(52) U.S. Cl.
CPC .......... *G03F 7/7065* (2013.01); *G03F 7/70008* (2013.01); *H01S 3/0092* (2013.01)

(58) Field of Classification Search
CPC ....................................................... H01S 3/10
USPC ............................................................ 372/34
See application file for complete search history.

(56) References Cited

U.S. PATENT DOCUMENTS

| | | | |
|---|---|---|---|
| 6,671,303 B1 * | 12/2003 | Pang | 372/59 |
| 6,697,391 B2 * | 2/2004 | Grossman et al. | 372/22 |
| 2003/0206568 A1 | 11/2003 | Comaskey et al. | |

(Continued)

FOREIGN PATENT DOCUMENTS

| | | |
|---|---|---|
| JP | 2007-157837 | 6/2007 |
| KR | 10-2010-0015929 | 2/2010 |

OTHER PUBLICATIONS

International Search Report and Written Opinion mailed on Mar. 18, 2014, for PCT Application No. PCT/US2013/071722 filed on Nov. 25, 2013, by KLA-Tencor Corporation, 12 pages.

*Primary Examiner* — Xinning Niu
*Assistant Examiner* — Vu A Vu
(74) *Attorney, Agent, or Firm* — Spano Law Group; Joseph S. Spano

(57) ABSTRACT

Systems and methods to improve the performance of nonlinear crystals in a resonant cavity are presented. A humidified purge gas is supplied to a resonant cavity of a laser based illumination source that includes a nonlinear crystal. A small amount of water vapor is added to a clean, dry purge gas to prevent excessive drying of the nonlinear crystal during storage or operation. In some embodiments, a humidity injection system includes at least two parallel flow paths. One flow path includes a humidity injector and another does not include humidity injection. The amount of water vapor added to the purge gas flow is determined at least in part by the relative flow rate between the parallel flow paths. In some embodiments, the amount of water vapor added to the purge gas flow is regulated based on a measurement of humidity in the resonant cavity.

16 Claims, 7 Drawing Sheets

(56) References Cited

U.S. PATENT DOCUMENTS

| | | |
|---|---|---|
| 2005/0008047 A1 | 1/2005 | Hashimoto et al. |
| 2009/0141746 A1 | 6/2009 | Fujikawa et al. |
| 2011/0261333 A1* | 10/2011 | Yamaguchi et al. ............ 355/30 |
| 2011/0310922 A1 | 12/2011 | Ko et al. |

* cited by examiner

RESONANT CAVITY CONDITIONING FOR IMPROVED NONLINEAR CRYSTAL PERFORMANCE

CROSS REFERENCE TO RELATED APPLICATIONS

The present application for patent claims priority under 35 U.S.C. §119 from U.S. provisional patent application Ser. No. 61/731,421, entitled "Method and Apparatus to Improve Performance of Nonlinear Crystal for DUV Laser Application," filed Nov. 29, 2012, the entire subject matter of which is incorporated herein by reference.

TECHNICAL FIELD

The described embodiments relate to systems and methods for conditioning a laser cavity.

BACKGROUND INFORMATION

Semiconductor devices such as logic and memory devices are typically fabricated by a sequence of processing steps applied to a substrate or wafer. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Inspection processes are used at various steps during a semiconductor manufacturing process to detect defects on wafers to promote higher yield. When inspecting specular or quasi-specular surfaces, such as semiconductor wafers, any combination of bright field (BF) and dark field (DF) modalities may be used, both to perform patterned wafer inspection and defect review. In general, the defect sensitivity of an inspection system is proportional to the wavelength of the illumination light divided by the NA of the objective. Without further improvement in NA, the overall defect sensitivity of current inspection tools is limited by the wavelength of the illumination source. In addition, viable inspection systems require high radiance illumination to maximize the defect sensitivity of the system.

Current wafer inspection systems typically employ illumination sources of deep ultraviolet (DUV) radiation with wavelengths as short as 260 nanometers with a high numerical aperture (NA). In some examples, illumination light may provided by an arc lamp. For example, electrode based, relatively high intensity discharge arc lamps are used in inspection systems. However, these light sources have a number of disadvantages. For example, electrode based, relatively high intensity discharge arc lamps have radiance limits and power limits due to electrostatic constraints on current density from the electrodes, the limited emissivity of gases as black body emitters, the relatively rapid erosion of electrodes made from refractory materials due to the presence of relatively large current densities at the cathodes, and the inability to control dopants (which can lower the operating temperature of the refractory cathodes) for relatively long periods of time at the required emission current.

In some other examples, illumination light is provided by a laser. One approach to realize the desired short wavelength emission has been the harmonic upconversion of longer wavelength sources. However, the average power that can be reliably sustained has been limited. A significant reliability problem is the failure of nonlinear crystals used in harmonic generators operating at relatively high average power.

Shorter wavelength illumination sources with the required radiance, average power, and reliability for future semiconductor processing applications are required. In particular, improvements in the reliability of crystal elements of relatively high average power lasers employing harmonic upconversion are desired.

SUMMARY

Systems and methods to improve the performance of nonlinear crystals in a resonant cavity are presented.

In one aspect, a humidified purge gas is supplied to a resonant cavity of a laser based illumination source that includes a nonlinear crystal. A small amount of water vapor is added to the clean, dry purge gas to prevent excessive drying of the nonlinear crystal during storage or operation. In some embodiments, a purge gas source supplies a flow of purge gas to a humidity injection system. The humidity injection system injects an amount of water vapor into a flow of purge gas to generate a flow of humidified purge gas that is supplied to a resonant cavity including a nonlinear crystal. In one example, the humidified purge gas flow is supplied to a fourth harmonic generator including a Barium Borate crystal. The fourth harmonic generator is configured to generate 266 nanometer wavelength emission with more than 200 milliwatts average power.

In one further aspect, a humidity injection system includes a humidity injector in a single flow path from a purge gas source to a resonant cavity including a nonlinear crystal.

In another further aspect, a humidity injection system includes at least two flow paths in parallel. At least one flow path includes a humidity injector and at least one other flow path does not include humidity injection. The amount of water vapor added to the purge gas flow is determined at least in part by the relative flow rate between the one or more flow paths that include a humidity injector and the one or more flow paths that do not include humidity injection.

In one further aspect, the humidity injection system is passively controlled. The amount of water vapor added to the purge gas flow is dictated by states of the system (e.g., flow rates, diffusion rates, valve settings, etc.) that remain fixed in time. In some examples, some elements (e.g., a valve setting or orifice size) may be manually tuned to achieve a desired performance.

In another further aspect, a humidity injection system includes at least one active element that is automatically controlled to regulate the amount of water vapor added to the purge gas flow based on a measurement of humidity in the resonant cavity. In some embodiments, the state of a flow control valve is adjusted based on a measurement of humidity in the resonant cavity.

The foregoing is a summary and thus contains, by necessity, simplifications, generalizations and omissions of detail. Consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

In many examples, a purge gas (e.g., clean, dry air, nitrogen, or other combination of inert gases) is supplied to a resonant cavity of a laser based illumination source to cool an optical crystal. Traditionally, systems are designed to supply purge gases to the resonant cavity with as little moisture as possible. Typically, purge gases supplied to resonant cavities have less than ten parts per million of water. In some examples, a clean, dry purge gas (e.g., clean, dry air) is available at the facility where the laser based illumination source is deployed. In these examples, the clean, dry purge gas is supplied directly to the cavity. In some other examples, an available purge gas (e.g., compressed air) is treated to remove as much moisture as possible before the purge gas is flowed through the resonant cavity. In one example, a desiccant (e.g., a molecular sieve) is used to remove moisture from the purge gas.

However, the inventors have discovered that a very dry operating environment actually degrades the performance of some nonlinear crystals. In some examples, the performance of Barium Borate (BBO) crystals employed as harmonic generators at average power levels greater than ten milliwatts exhibit low laser stability, high noise, and short operating life using a clean, dry purge gas. In some examples, the performance of Barium Borate (BBO) crystals employed as harmonic generators at average power levels greater than one hundred milliwatts exhibit low laser stability, high noise, and short operating life using a clean, dry purge gas. In some examples, BBO crystals purged with clean, dry air (CDA) exhibit significant material degradation within one hundred hours of operation. The material degradation leads to an inability to maintain output power in the DUV wavelength range.

In one aspect, a humidified purge gas is supplied to a resonant cavity of a laser based illumination source that includes a nonlinear crystal. A small amount of water vapor is added to the clean, dry purge gas to prevent excessive drying of the nonlinear crystal during storage or operation. Excessively dry crystals tend to develop micro cracks that degrade crystal performance as a frequency doubling element. Purging with a humidified purge gas helps prevent, or even reverse, crystal degradation. Another possible benefit is the reduction of free charges inside and around the crystal surface. Charges can create local fields that are strong enough to affect crystal performance and result in beam degradation. The water molecules of a humidified purge gas tend to sweep charges away from the active region inside and outside of the nonlinear crystal.

Figure 1:
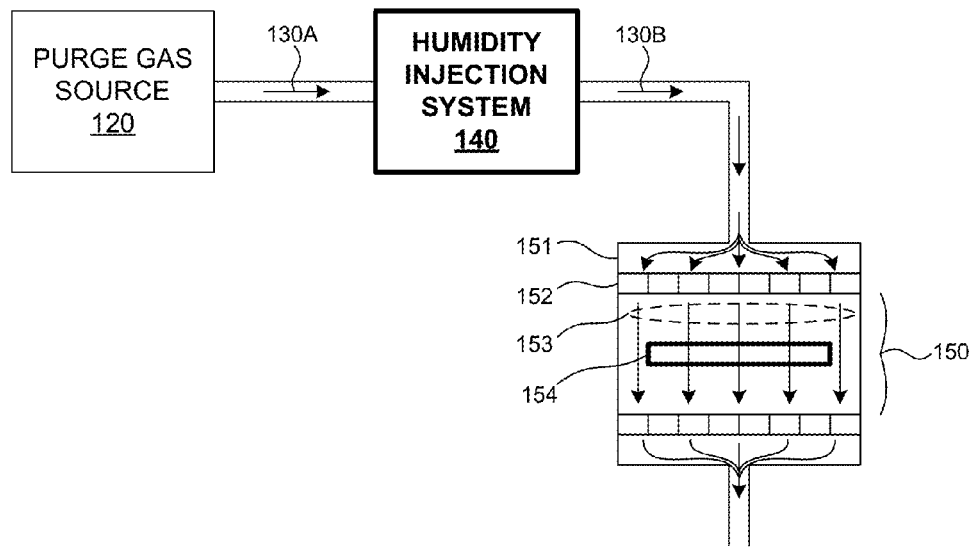
FIG. 1 is a diagram illustrative of humidity injection system 140 configured to generate humidified purge gas 130B supplied to a resonant optical cavity 150.

FIG. 1 is a diagram illustrative of humidity injection system 140 configured to generate humidified purge gas 130B supplied to a resonant optical cavity 150. Resonant optical cavity 150 includes a nonlinear crystal 154. The performance and lifetime of the nonlinear crystal as a frequency doubler (i.e., wavelength divider) is improved by flowing the humidified purge gas 130B through the resonant cavity 150. In one non-limiting example, nonlinear crystal 154 is a BBO crystal. However, other crystals (e.g., Lithium Triborate (LBO), Potassium Titanyl Phosphate (KTP), Potassium Di*deuterium Phosphate (KDP, KD*P) and its Isomorphs, Lithium Iodate (LiIO3), infrared nonlinear optical crystals such as AgGaS2, AgGaSe2, GaSe, and ZnGeP2, etc.) may also be contemplated.

In the depicted embodiment, a purge gas source 120 supplies a flow of purge gas 130A to humidity injection system 140. Humidity injection system 140 injects an amount of water vapor into a flow of purge gas 130A to generate the flow of humidified purge gas 130B. The humidified purge gas 130B is supplied to resonant cavity 150 and flowed through the cavity. In the depicted embodiment, resonant cavity 150 is vented to the atmosphere. However, in some other embodiments, a portion or all of humidified purge gas 130B may be recycled back to purge gas source 120 for further treatment (e.g., cooling, filtering, dehumidifying, etc.) and eventual reuse as a purge gas.

In the depicted embodiment, additional flow conditioning elements are employed to generate a uniform, laminar flow 153 through resonant cavity 150. Uniform, laminar flows promote efficient cooling without inducing undesireable noise levels in the laser light output. In the depicted embodiment, a plenum 151 and a set of baffles 152 are employed to promote a uniform, laminar flow through the resonant cavity 150.

In some embodiments, the desired amount of water in the humidified purge gas flow 130B is between 50 parts per million (ppm) and 5,000 ppm. In some embodiments, the desired amount of water in the humidified purge gas flow 130B is between 200 ppm and 2,000 ppm. In a preferred embodiment employing a BBO crystal, the humidified purge gas flow 130B is between 900 ppm and 1,200 ppm. As many nonlinear crystals (e.g., BBO) are hydroscopic, exposure to excessive moisture will cause the material to degrade. For example, exposure to ambient air (approximately 10,000 ppm water) will lead to undesirable material degradation. Thus, the amount of water vapor added to purge gas flow 130A must be carefully controlled.

Figure 2:
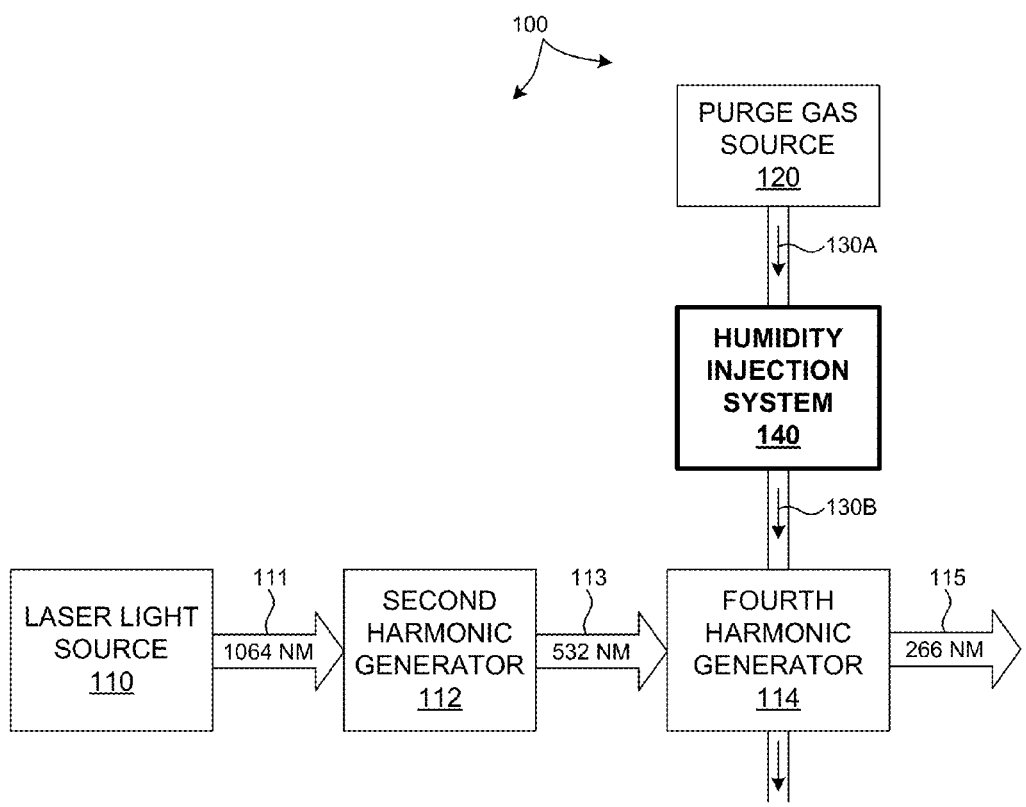
FIG. 2 is a diagram illustrative of a laser based illumination system 100 employing a humidity injection system 140 to improve nonlinear crystal performance in one exemplary embodiment.

FIG. 2 is a diagram illustrative of a laser based illumination system 100 employing a humidity injection system 140 to improve nonlinear crystal performance in one exemplary embodiment. In the depicted embodiment, laser based illumination system 100 is configured to generate 266 nanometer wavelength emission at more than 200 milliwatts average power. As such, laser based illumination system 100 is a useful for modern wafer inspection systems. Laser based illumination system 100 includes a laser light source 110 configured to emit light 111 at wavelengths near 1064 nanometers. In the depicted embodiment, laser light source 110 is a ND:YAG laser. Light 111 emitted from the ND:YAG laser enters Second Harmonic Generator (SHG) 112. SHG 112 is configured to double the frequency (halve the wavelength) of a portion of light 111. As such, SHG 112 emits an amount of light 113 at wavelengths near 532 nanometers. Light 113 emitted from SHG 112 enters Fourth Harmonic Generator (FHG) 114. FHG 114 is configured to double the frequency (halve the wavelength) of a portion of light 113. As such, FHG 112 emits an amount of light 115 at wavelengths near 266 nanometers. FHG 114 includes a BBO crystal in a resonant cavity. As depicted in FIG. 2, a purge gas source 120 supplies a flow of purge gas 130A to humidity injection system 140. In one example, the flow of purge gas 130A to humidity injection system 140 is approximately 0.5 liters per minute from a purge source 120 that supplies clean, dry air at a pressure of approximately 50 psi. In one novel aspect, humidity injection system 140 injects an amount of water vapor into purge gas flow 130A to generate humidified purge gas flow 130B. The humidified purge gas flow 130B is supplied to a resonant cavity of FHG 114 to improve the performance of the BBO crystal.

In the depicted embodiment, laser based illumination system 100 is configured to generate 266 nanometer wavelength emission using a resonant cavity (e.g., resonant cavity of FHG 114) that includes a BBO crystal. However, in general, a laser based illumination system employing a humidity injection system to improve nonlinear crystal performance may generate emission at any wavelength between 180 and 355 nanometers with more than 200 milliwatts average power.

As depicted in FIG. 2, a humidified flow is provided to FHG 114. However, in general, a humidified flow could be provided to any element of laser based illumination source 100 that includes a nonlinear crystal (e.g., BBO) that benefits from a humidified purge gas flow.

To generate a humidified purge gas flow, humidity injection system includes a humidity injector that injects a controlled amount of water vapor into the flow of purge gas. A number of non-limiting embodiments are described to achieve controlled injection of water vapor into the purge gas flow.

Figure 3:
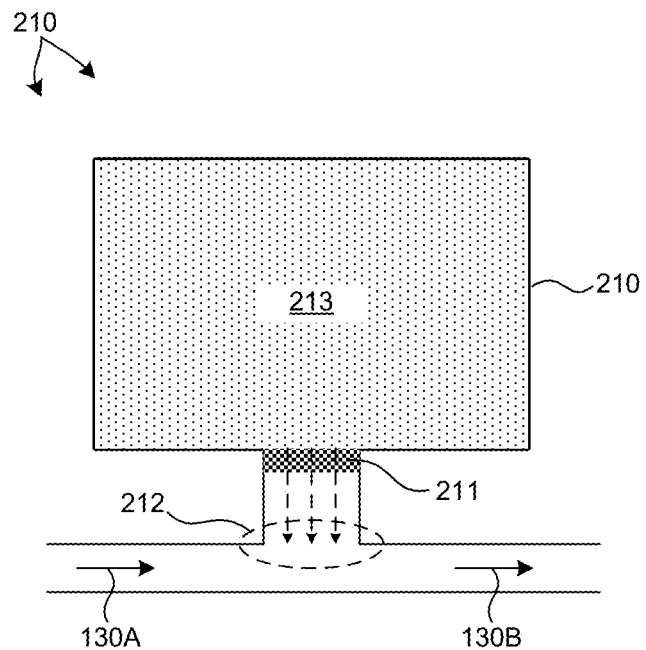
FIG. 3 is a diagram illustrative of a humidity injector 210 in another embodiment.

FIG. 3 is a diagram illustrative of a humidity injector 210 in one embodiment. Humidity injector 210 includes a reservoir 210 including a solid medium 213 that stores an amount of water. By way of non-limiting example, water storage medium 213 may be a salt or foam material saturated with water. In the depicted embodiment, reservoir 210 is a closed container storing enough water to operate the laser based illumination system 100 for its planned operational lifetime (e.g., 20,000 hours). In this manner, humidified purge gas flow can be provided to elements of laser based illumination system 100 without periodic water replacement or connection to a water source. However, in some other embodiments, reservoir 210 may be maintained by a continuous supply of water or may be configured as a cartridge that is subject to periodic replacement or replenishment.

As depicted in FIG. 3, purge gas flow 130A passes an opening 212 that is exposed to a water tight, but vapor permeable membrane 211. As the dry purge gas flow 130A passes by opening 212, an amount of water vapor diffuses through vapor permeable membrane 211 and mixes with dry purge gas flow 130A to generate humidified purge gas flow 130B.

Figure 4:
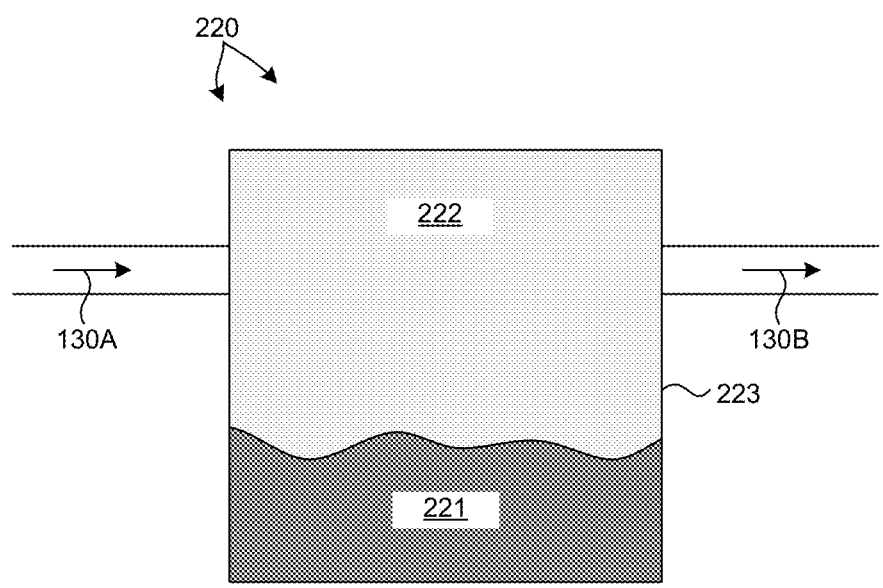
FIG. 4 is a diagram illustrative of a humidity injector 220 in another embodiment.

FIG. 4 is a diagram illustrative of a humidity injector 220 in another embodiment. Humidity injector 220 includes a reservoir 223 including an amount of condensed water 221 and an amount of water vapor 222. Reservoir 220 is a closed container storing enough water to operate the laser based illumination system 100 for its planned operational lifetime (e.g., 20,000 hours). In this manner, humidified purge gas flow can be provided to elements of laser based illumination system 100 without periodic water replacement or connection to a water source. However, in some other embodiments, reservoir 210 may be maintained by a continuous supply of water or may be configured for periodic replacement or replenishment. As depicted in FIG. 4, dry purge gas flow 130A passes into reservoir 223 and mixes with water vapor 222 to generate humidified purge gas flow 130B.

Figure 5:
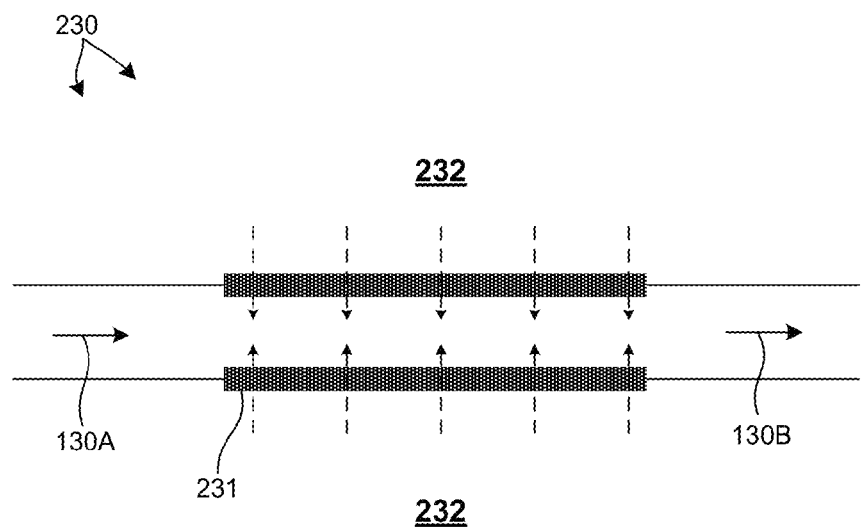
FIG. 5 is a diagram illustrative of a humidity injector 230 in another embodiment.

FIG. 5 is a diagram illustrative of a humidity injector 230 in another embodiment. Humidity injector 230 includes a vapor permeable element 231 through which dry purge gas flow 130A is passed. In one example, vapor permeable element 231 is a tube constructed of Nafion® material approximately three inches in length. (Nafion® is a registered trademark of E. I. du Pont de Nemours and Company). Water vapor in the ambient environment 232 diffuses through vapor permeable element 231 and mixes with dry purge gas flow 130A to generate humidified purge gas flow 130B. Humidity injector 230 relies on the humidity in the ambient environment 232 as the source of water vapor. As a result, maintenance requirements are minimal.

Figure 6:
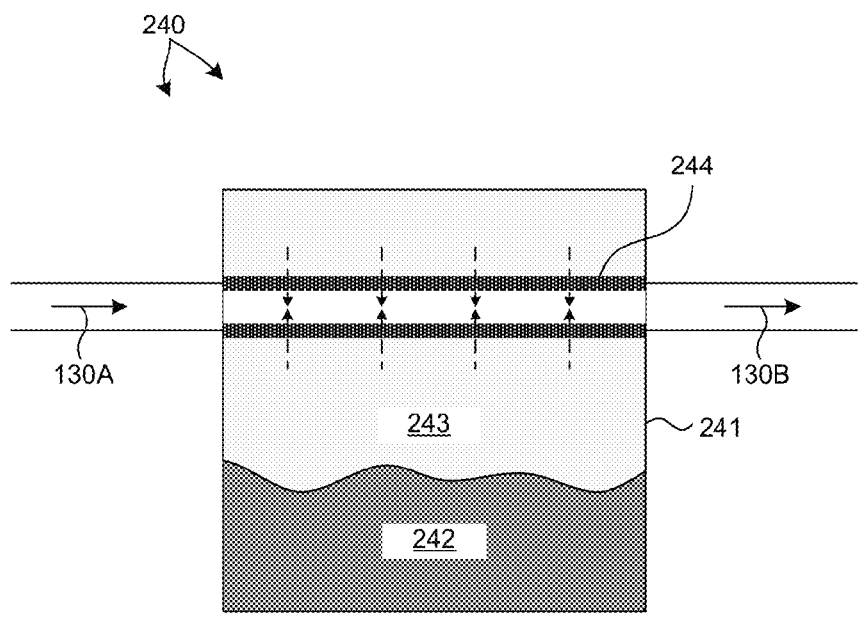
FIG. 6 is a diagram illustrative of a humidity injector 240 in another embodiment.

FIG. 6 is a diagram illustrative of a humidity injector 240 in another embodiment. Humidity injector 240 includes a reservoir 241 including an amount of condensed water 242 and water vapor 243. Humidity injector 240 also includes a vapor permeable element 244 through which dry purge gas flow 130A is passed, as discussed with reference to FIG. 5. However, vapor permeable element 244 is located within reservoir 241 and is exposed to water vapor 243. Water vapor diffuses through vapor permeable element 244 and mixes with dry purge gas flow 130A to generate humidified purge gas flow 130B. As discussed with reference to FIG. 5, humidity injector 230 relies on the humidity in the ambient environment 232 as the source of water vapor. Humidity injector 240 replaces the ambient environment 232 with a reservoir of water vapor. In some embodiments, the concentration of water vapor may be regulated (e.g., by controlling temperature and/or pressure of reservoir 241) to achieve a more uniform rate of diffusion across vapor permeable element 244.

In one aspect, a humidity injection system includes a humidity injector (e.g., any of humidity injector 210, 220, 230, and 240) in a single flow path from a purge gas source to a resonant cavity including a nonlinear crystal.

However, in a further aspect, a humidity injection system includes at least two flow paths in parallel. At least one flow path includes a humidity injector and at least one other flow path does not include humidity injection. The amount of water vapor added to the purge gas flow is determined at least in part by the relative flow rate between the one or more flow paths that include a humidity injector and the one or more flow paths that do not include humidity injection.

Figure 7:
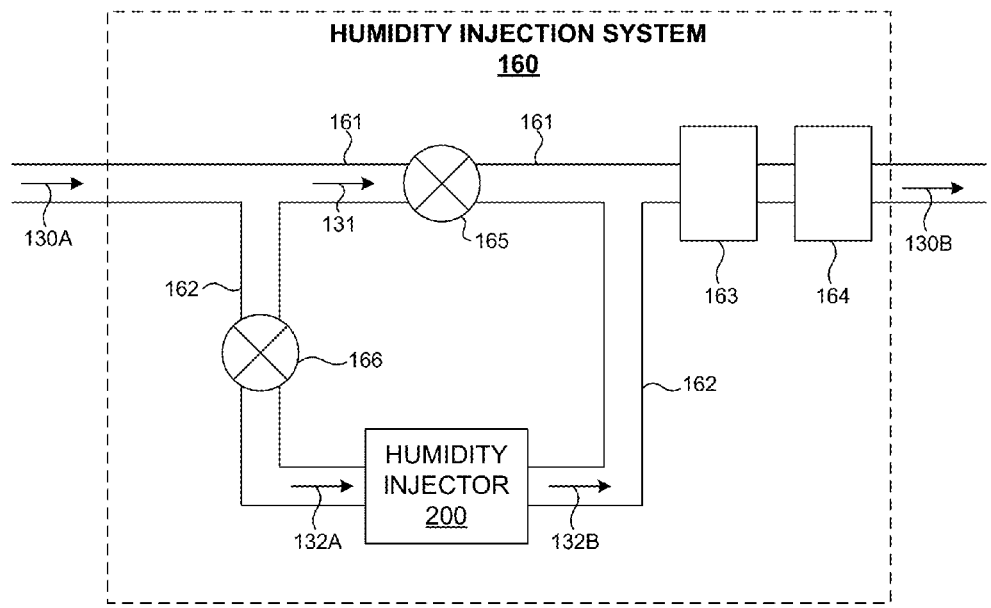
FIG. 7 is a diagram illustrative a humidity injection system 160 including at least two parallel flow paths in one embodiment.

FIG. 7 is a diagram illustrative of an embodiment of a humidity injection system 160 including at least two parallel flow paths. As depicted in FIG. 7, purge gas flow 130A enters humidity injection system 160 and bifurcates into a purge gas flow 131 that flows through flow path 161 and purge gas flow 132A that flows through flow path 162. As depicted, flow path 162 includes a humidity injector 200. By way of non-limiting example, humidity injector 200 may be any of humidity injectors 210, 220, 230, and 240 described herein. Purge gas flow 132A passes through humidity injector 200. Humidity injector 200 adds an amount of water vapor to the purge gas flow to generate humidified purge gas flow 132B. In contrast, water vapor is not added to purge gas flow 131. Purge gas flow 131 and humidified purge gas flow 132B are combined in humidity injection system 160 to generate humidified purge gas flow 130B. In a preferred embodiment, purge gas flow 130B is passed through a particle filter 163 and a purifier 164 to further condition humidified purge gas flow 130B before entering resonant cavity 150. Particle filter 163 removes potential particle contaminants that may have accumulated in the purge gas flow. Purifier 164 removes chemical contaminates (e.g., hydrocarbons, polymers, etc.) that may have accumulated in humidified purge gas flow 130B. In particular, vapor permeable elements, such as a Nafion® tube, are not only permeable to water vapor, but to other vapors as well. Hence, other undesireable vapors may injected into the purge gas flow by humidity injector 200. Purifier 164 is configured to remove these undesirable vapors before humidified purge gas flow 130B flowed through resonant cavity 150.

As depicted in FIG. 7, the amount of water vapor injected into purge gas flow 130A depends, at least in part, on the ratio between the portion of purge gas flow 130A that flows through flow path 161 (i.e., purge gas flow 131) and the portion of purge gas flow 130A that flows through flow path 162 (i.e., purge gas flow 132A). As illustrated, water vapor is added to purge gas flow 132A, while water vapor is not added to purge gas flow 131. Hence, a change in the ratio between purge gas flow 132A and purge gas flow 131 impacts the amount of water vapor in humidified purge gas flow 130B.

In the depicted embodiment, humidity injection system 160 includes a flow control valve 165 in flow path 161 and another flow control valve 166 in flow path 162. Flow control valves 165 and 166 are adjustable to provide more or less effective resistance to a flow passing through each respective valve. For example in a closed state, a flow control valve does not let allow any flow to pass through (i.e., infinite resistance). As the flow control valve is opened, the resistance to flow is reduced, and consequently, the rate of flow through the flow control valve increases for a given pressure differential across the valve. In this manner, by changing the state of the flow control valve (e.g., the size of an opening through the flow control valve), the flow rate through the valve can be controlled. In the depicted embodiment, the state of flow control valve 165 and the state of flow control valve 166 determine an effective flow resistance through humidity injection system 160. Hence, in combination, flow control valves 165 and 166 determine, in part, the total flow through humidity injection system 160. For example, if both flow control valves 165 and 166 are adjusted toward a closed state, the total flow through humidity injection system 160 is reduced, and vice-versa. However, if the states of flow control valves 165 and 166 are adjusted in opposite, the ratio of flow through flow path 161 and flow path 162 changes. Thus, the amount of water vapor injected into purge gas flow 130A is adjusted by changing the state of flow control valve 165 in opposite to the state of flow control valve 166. For example, for a fixed flow rate of humidified purge gas 130B, if more humidity is required flow control valve 166 is adjusted to a more open state, while flow control valve 165 is adjusted to a more closed state.

Figure 8:
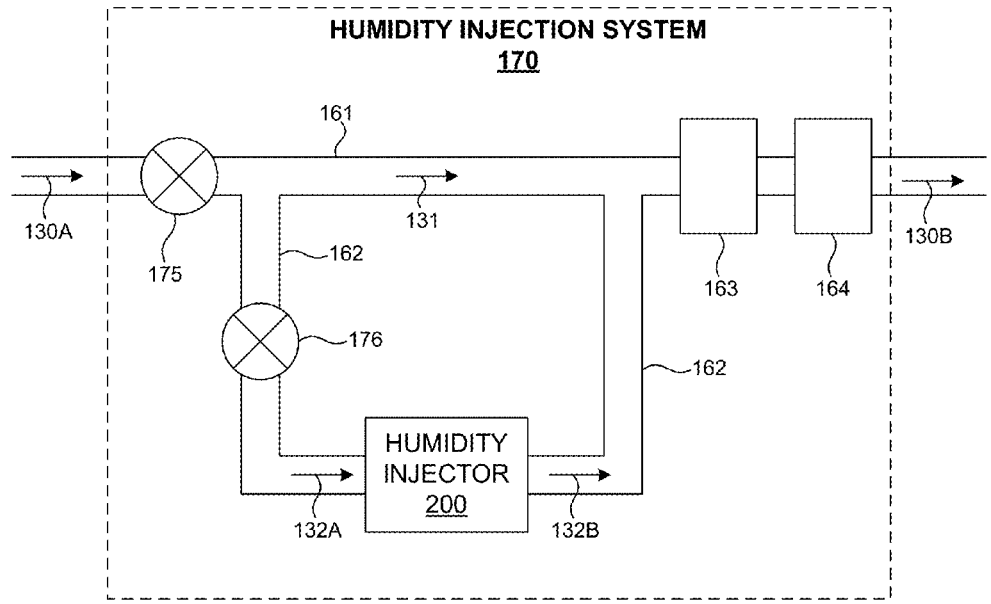
FIG. 8 is a diagram illustrative a humidity injection system 170 including at least two parallel flow paths in another embodiment.

FIG. 8 is a diagram illustrative of another embodiment of a humidity injection system 170 including at least two parallel flow paths. As illustrated in FIG. 8, humidity injection system 170 includes similar, like numbered elements described with reference to FIG. 7. As depicted in FIG. 8, purge gas flow 130A enters humidity injection system 170 and bifurcates into a purge gas flow 131 that flows through flow path 161 and purge gas flow 132A that flows through flow path 162. As depicted, flow path 162 includes a humidity injector 200. By way of non-limiting example, humidity injector 200 may be any of humidity injectors 210, 220, 230, and 240 described herein. Purge gas flow 132A passes through humidity injector 200. Humidity injector 200 adds an amount of water vapor to the purge gas flow to generate humidified purge gas flow 132B. In contrast, water vapor is not added to purge gas flow 131. Purge gas flow 131 and humidified purge gas flow 132B are combined in humidity injection system 170 to generate humidified purge gas flow 130B.

As depicted in FIG. 8, the amount of water vapor injected into purge gas flow 130A depends, at least in part, on the ratio between the portion of purge gas flow 130A that flows through flow path 161 (i.e., purge gas flow 131) and the portion of purge gas flow 130A that flows through flow path 162 (i.e., purge gas flow 132A). As illustrated, water vapor is added to purge gas flow 132A, while water vapor is not added to purge gas flow 131. Hence, a change in the ratio between purge gas flow 132A and purge gas flow 131 impacts the amount of water vapor in humidified purge gas flow 130B.

In the depicted embodiment, humidity injection system 160 includes flow control valve 175 in the path of incoming purge gas flow 130A and flow control valve 176 in flow path 162. The state of flow control valve 175 determines in part the total flow through humidity injection system 160. The state of flow control valve 176 determines the ratio of flow through flow path 161 and flow path 162. Thus, the amount of water vapor injected into purge gas flow 130A is adjusted by changing the state of flow control valve 176. Although, as depicted, flow control valve 176 is located in flow path 162, including humidity injector 200, flow control valve 176 could be located in flow path 161.

Figure 9:
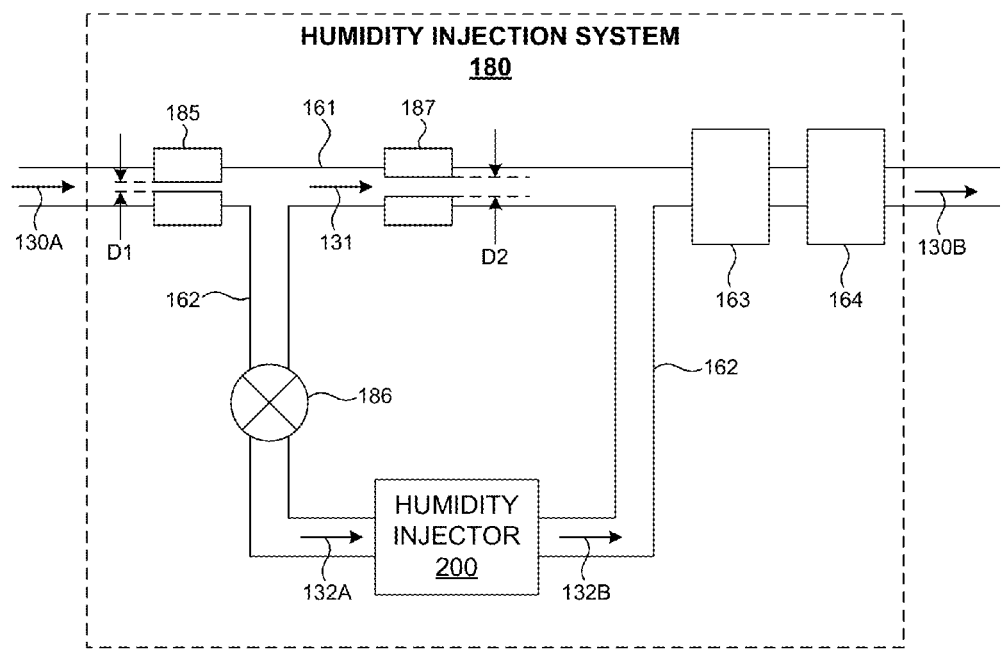
FIG. 9 is a diagram illustrative a humidity injection system 180 including at least two parallel flow paths in another embodiment.

FIG. 9 is a diagram illustrative of yet another embodiment of a humidity injection system 180 including at least two parallel flow paths. As illustrated in FIG. 9, humidity injection system 180 includes similar, like numbered elements described with reference to FIG. 7. As depicted in FIG. 9, purge gas flow 130A enters humidity injection system 180 and bifurcates into a purge gas flow 131 that flows through flow path 161 and purge gas flow 132A that flows through flow path 162. As depicted, flow path 162 includes a humidity injector 200. By way of non-limiting example, humidity injector 200 may be any of humidity injectors 210, 220, 230, and 240 described herein. Purge gas flow 132A passes through humidity injector 200. Humidity injector 200 adds an amount of water vapor to the purge gas flow to generate humidified purge gas flow 132B. In contrast, water vapor is not added to purge gas flow 131. Purge gas flow 131 and humidified purge gas flow 132B are combined in humidity injection system 180 to generate humidified purge gas flow 130B.

As depicted in FIG. 9, the amount of water vapor injected into purge gas flow 130A depends, at least in part, on the ratio between the portion of purge gas flow 130A that flows through flow path 161 (i.e., purge gas flow 131) and the portion of purge gas flow 130A that flows through flow path 162 (i.e., purge gas flow 132A). As illustrated, water vapor is added to purge gas flow 132A, while water vapor is not added to purge gas flow 131. Hence, a change in the ratio between purge gas flow 132A and purge gas flow 131 impacts the amount of water vapor in humidified purge gas flow 130B.

In the depicted embodiment, humidity injection system 180 includes an orifice 185 with a diameter, D1, in the path of incoming purge gas flow 130A, an orifice 187 with a diameter, D2, in flow path 161, and a flow control valve 186 in flow path 162. The state of flow control valve 186 determines in part the ratio of flow through flow path 161 and flow path 162. Thus, the amount of water vapor injected into purge gas flow 130A is adjusted by changing the state of flow control valve 186. The diameter, D2, of orifice 187 is larger than diameter, D1, of orifice 185. In this manner, orifice 185 regulates the total flow through humidity injection system 160. The diameter, D2, of orifice 187 is selected to generate effective resistance on the order of flow control valve 186, so that the state of flow control valve 186 has a significant impact on the ratio of flow through flow path 161 and flow path 162. In one example, D2 is approximately five thousandths of an inch and D1 is approximately ten thousandths of an inch. Although, as depicted, flow control valve 186 is located in flow path 162, including humidity injector 200, flow control valve 186 could be located in flow path 161, and orifice 187 could be located in flow path 162.

In one aspect, a humidity injection system is passively controlled. In other words, the amount of water vapor added to the purge gas flow is dictated by elements of the system (e.g., flow rates, diffusion rates, valve settings, etc.) that remain fixed in time. In some examples, some elements (e.g., a valve setting or orifice size) may be manually tuned to achieve a desired performance.

However, in another aspect, a humidity injection system includes at least one active element that is automatically controlled to regulate the amount of water vapor added to the purge gas flow.

Figure 10:
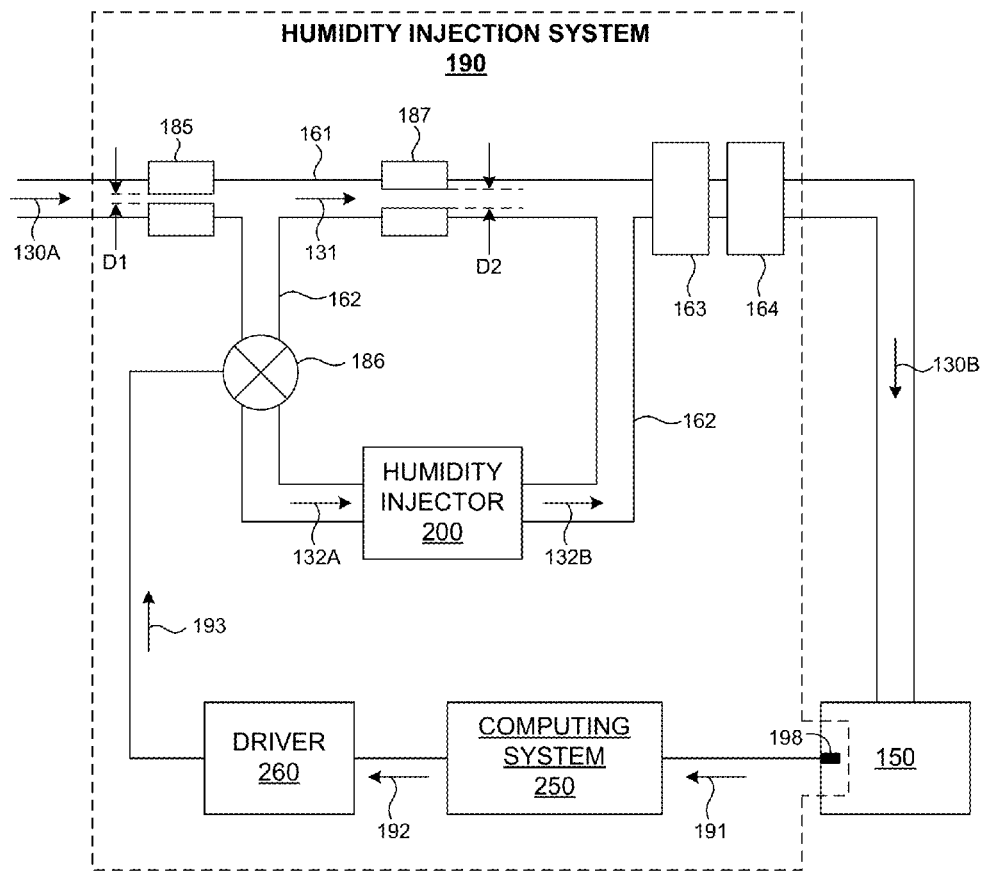
FIG. 10 is a diagram illustrative of an embodiment of a humidity injection system 190 including automatic control of the amount of water vapor added to the purge gas flow.

FIG. 10 is a diagram illustrative of a preferred embodiment of a humidity injection system 190 including the automatic control of the amount of water vapor added to the purge gas flow. As illustrated in FIG. 10, humidity injection system 190 includes similar, like numbered elements described with reference to FIG. 7 and FIG. 9. As depicted in FIG. 10, purge gas flow 130A enters humidity injection system 190 and bifurcates into a purge gas flow 131 that flows through flow path 161 and purge gas flow 132A that flows through flow path 162. As depicted, flow path 162 includes a humidity injector 200. By way of non-limiting example, humidity injector 200 may be any of humidity injectors 210, 220, 230, and 240 described herein. Purge gas flow 132A passes through humidity injector 200. Humidity injector 200 adds an amount of water vapor to the purge gas flow to generate humidified purge gas flow 132B. In contrast, water vapor is not added to purge gas flow 131. Purge gas flow 131 and humidified purge gas flow 132B are combined in humidity injection system 180 to generate humidified purge gas flow 130B.

As depicted in FIG. 9, the amount of water vapor injected into purge gas flow 130A depends, at least in part, on the ratio between the portion of purge gas flow 130A that flows through flow path 161 (i.e., purge gas flow 131) and the portion of purge gas flow 130A that flows through flow path 162 (i.e., purge gas flow 132A). As illustrated, water vapor is added to purge gas flow 132A, while water vapor is not added to purge gas flow 131. Hence, a change in the ratio between purge gas flow 132A and purge gas flow 131 impacts the amount of water vapor in humidified purge gas flow 130B. In the depicted embodiment, the state of flow control valve 186 determines in part the ratio of flow through flow path 161 and flow path 162. Thus, the amount of water vapor injected into purge gas flow 130A is adjusted by changing the state of flow control valve 186.

In one further aspect, the state of flow control valve 186 is adjusted based on a measurement of humidity in resonant cavity 150. As depicted in FIG. 10, a humidity sensor 198 is located in resonant cavity 150. Humidity sensor 198 generates a signal 191 indicative of the amount of water vapor in resonant cavity 150. Signal 191 is communicated to computing system 250. Computing system 250 is configured to receive signal 191 and generate a control signal 192 based on the measured humidity. Control signal 192 is communicated to a driver 260 (e.g., an amplifier) that converts the control signal 192 into a control signal 193 with sufficient power to drive a transducer of flow control valve 186. Control signal 193 is communicated to flow control valve 186. The transducer (e.g., piezo stack, solenoid, etc.) receives control signal 193 and changes the state of flow control valve 186 in response to the control signal 193. In this manner, the amount of water vapor injected into purge gas flow 130A by humidity injection system 190 is changed based on a measurement of the humidity in resonant cavity 150.

Figure 11:
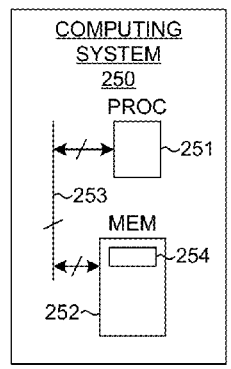
FIG. 11 is a diagram illustrative of the computing system 250 of FIG. 10 in greater detail.

Referring to FIG. 11, computing system 250 includes a processor 251 and an amount of computer readable memory 252. As depicted in FIG. 10, by way of example, humidity injection system 190 includes processor 251 and memory 252, however, processor 251 and memory 252 may be included in other components of a laser based illumination source 100. Processor 251 and memory 252 may communicate over bus 253. Memory 252 includes an amount of memory 254 that stores a program code that, when executed by processor 251, causes processor 251 to adjust the amount of water vapor injected into purge gas 130A based on a measurement of humidity of humidified purge gas flow 130B through resonant cavity 150. In one example, the amount of water vapor injected into purge gas 130A is adjusted by changing the ratio between a flow through a flow path that includes water vapor injection and a flow path that does not include water vapor injection.

Humidity injection systems 160, 170, 180, and 190 are provided by way of non-limiting example. Many other configurations suitable to introduce a controlled amount of water vapor into a purge gas flowed through a resonant cavity including a nonlinear crystal may be contemplated.

Figure 12:
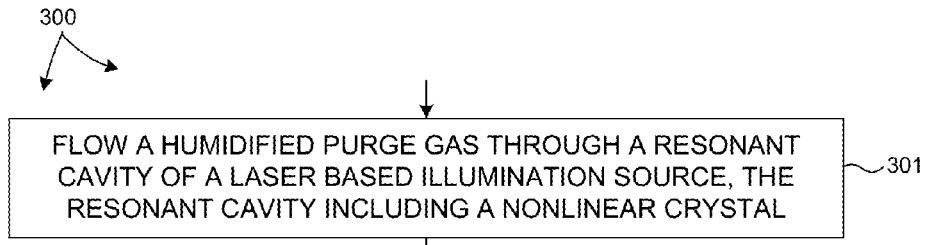
FIG. 12 is a flowchart illustrative of one exemplary method 300 of improving nonlinear crystal performance in a resonant cavity in at least one novel aspect.

FIG. 12 illustrates a flowchart of an exemplary method 300 useful for improving nonlinear crystal performance in a resonant cavity. In block 301, a humidified purge gas is flowed through a resonant cavity that includes a BBO crystal.

Figure 13:
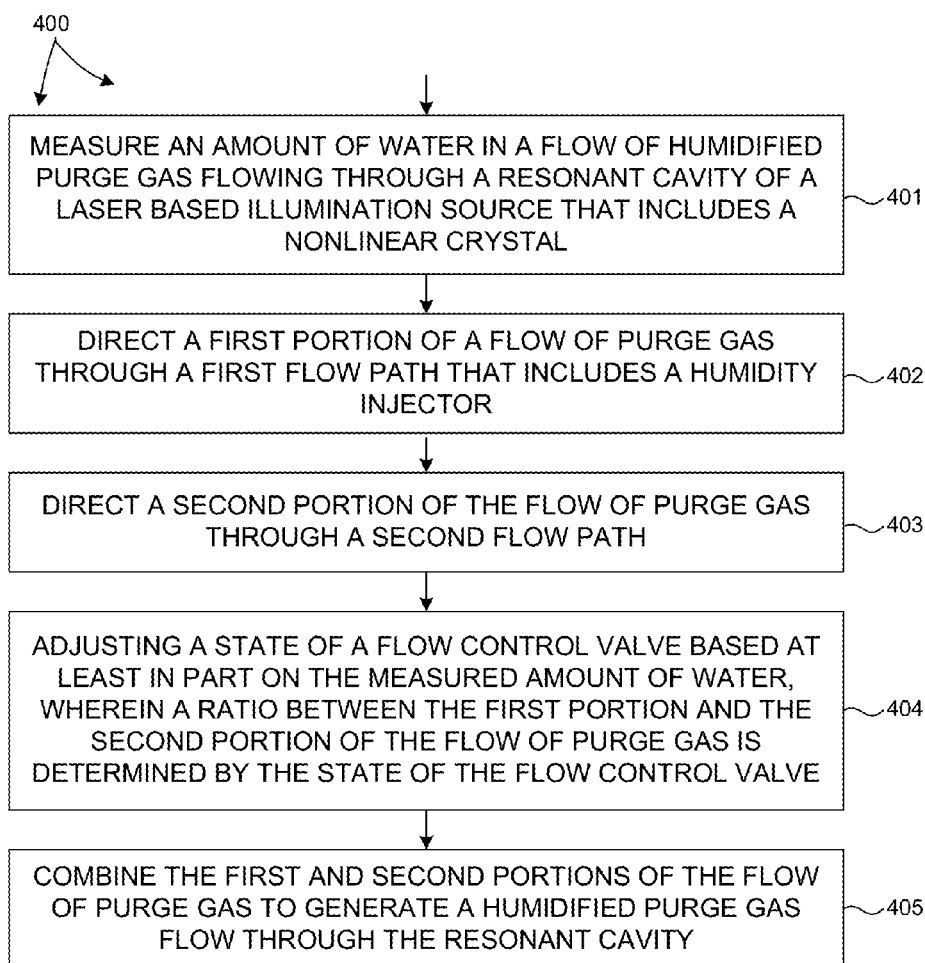
FIG. 13 is a flowchart illustrative of one exemplary method 400 of improving nonlinear crystal performance in a resonant cavity in at least one novel aspect.

FIG. 13 illustrates a flowchart of an exemplary method 400 useful for improving nonlinear crystal performance in a resonant cavity.

In block 401, an amount of water vapor in a flow of humidified purge gas flowing through a resonant cavity of a laser based illumination source that includes a Barium Borate crystal is measured.

In block 402, a first portion of a purge gas flow is directed through a first flow path that includes a humidity injector.

In block 403, a second portion of the purge gas flow is directed through a second flow path.

In block 404, the state of a flow control valve is adjusted based at least in part on the measured amount of water vapor. A ratio between the first portion of the purge gas flow and the second portion of the purge gas flow is determined by the state of the flow control valve.

In block 405, the first portion of the purge gas flow and the second portion of the purge gas flow are combined to generate a humidified purge gas flow through the resonant cavity.

In general, a humidity injection system may be configured as part of a laser based illumination system. While other critical optical parts of the illumination system may be purged by clean, dry purge gas including trace amounts of water (e.g., ~2-10 ppm), a resonant cavity including a nonlinear crystal (e.g., a FHG with a BBO crystal) may be purged with humidified purge gas (e.g., 50-5,000 ppm).

Various embodiments are described herein for a semiconductor processing system (e.g., an inspection system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as quartz. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A laser based illumination system comprising:
   a resonant cavity including a nonlinear crystal, the resonant cavity configured to be cooled by a flow of humidified purge gas through the resonant cavity; and
   a humidity injection system configured to generate the flow of humidified purge gas by injecting an amount of water vapor into a flow of purge gas directed toward the resonant cavity, wherein an amount of water in the flow of humidified purge gas is between 50 parts per million and 5,000 parts per million.

2. The laser based illumination system of claim 1, wherein an amount of water in the flow of humidified purge gas is between 200 parts per million and 2,000 parts per million.

3. The laser based illumination system of claim 1, wherein the humidity injection system includes a humidity injector with a self-contained supply of water.

4. The laser based illumination system of claim 1, wherein the humidity injection system is configured to direct a first portion of the flow of purge gas through a first flow path and a second portion of the flow of purge gas through a second flow path, and wherein the humidity injection system includes:
   a humidity injector in the first flow path; and
   a first flow control valve, wherein the first flow control valve determines a ratio between the first portion and the second portion of the flow of purge gas.

5. The laser based illumination system of claim 4, wherein the humidity injection system also includes:
   a second flow control valve, wherein the second control valve in combination with the first flow control valve determines a flow rate of the flow of purge gas through the humidity injection system.

6. The laser based illumination system of claim 4, wherein the humidity injection system also includes:
   a humidity sensor configured to generate a measurement signal indicative of an amount of water vapor in the flow of humidified purge gas through the resonant cavity;
   a computing system operable to receive the measurement signal and determine a first control signal based at least in part on the measurement signal; and
   a driver configured to receive the first control signal and generate a second control signal, wherein the first flow control valve receives the second control signal and changes state to adjust the ratio between the first portion and the second portion of the flow of purge gas in response to the second control signal.

7. The laser based illumination system of claim 6, wherein the humidity injection system also includes:
   a second flow control valve, wherein the second control valve in combination with the first flow control valve determines a flow rate of the flow of purge gas through the humidity injection system.

8. The laser based illumination system of claim 1, wherein the resonant cavity is a fourth harmonic generator of the laser based illumination system.

9. The laser based illumination system of claim 8, wherein the fourth harmonic generator of the laser based illumination system is configured to generate an amount of illumination in a wavelength range between 180 nanometers and 355 nanometers with an average power of more than ten milliwatts.

10. A method comprising:
flowing a humidified purge gas through a resonant cavity of a laser based illumination source, the resonant cavity including a nonlinear crystal, wherein the humidified purge gas includes between 50 parts per million and 5,000 parts per million of water, wherein the flowing of the humidified purge gas through the resonant cavity involves injecting an amount of water vapor into a flow of purge gas directed toward the resonant cavity, wherein the injecting the amount of water vapor into the flow of purge gas involves:
  directing a first portion of the flow of purge gas through a first flow path that includes a humidity injector;
  directing a second portion of the flow of purge gas through a second flow path;
  measuring a humidity in the resonant cavity;
  determining a state of a flow control valve based at least in part on the measured humidity, wherein a ratio between the first portion and the second portion of the flow of purge gas is based on the state of the flow control valve; and
  combining the first and second portions of the flow of purge gas to generate the humidified purge gas flow.

11. The method of claim 10, wherein the humidified purge gas includes between 200 parts per million and 2,000 parts per million of water.

12. An apparatus comprising:
a humidity sensor configured to generate a measurement signal indicative of an amount of water vapor in a flow of humidified purge gas through a resonant cavity of a laser based illumination system;
a computing system operable to receive the measurement signal and generate a control signal based at least in part on the measurement signal; and
a flow control valve configured to adjust the amount of water vapor injected in the flow of humidified purge gas in response to the control signal, wherein the flow of humidified purge gas includes between 50 and 5,000 parts per million of water.

13. The apparatus of claim 12, further comprising:
a humidity injector, wherein the flow control valve adjusts a flow of purge gas through the humidity injector.

14. The apparatus of claim 12, further comprising:
a first flow path including a humidity injector; and
a second flow path, wherein the flow control valve determines a ratio between a first flow of purge gas through the first path and a second flow of purge gas through the second flow path, and wherein the flow of humidified purge gas includes the first and second flows of purge gas.

15. The apparatus of claim 12, wherein the flow of humidified purge gas includes between 200 parts per million and 2,000 parts per million of water.

16. The apparatus of claim 12, wherein the resonant cavity is a fourth harmonic generator of a laser based illumination system that includes a barium borate nonlinear crystal.

* * * * *